(12) United States Patent
Hirai et al.

(10) Patent No.: US 6,711,815 B2
(45) Date of Patent: Mar. 30, 2004

(54) FABRICATING METHOD OF SEMICONDUCTOR DEVICES

(75) Inventors: Sumie Hirai, Inagi (JP); Jun Ohmori, Tokyo (JP)

(73) Assignee: Kabushiki Kaisha Toshiba, Kawazaki (JP)

( * ) Notice: Subject to any disclaimer, the term of this patent is extended or adjusted under 35 U.S.C. 154(b) by 0 days.

(21) Appl. No.: 10/225,200

(22) Filed: Aug. 22, 2002

(65) Prior Publication Data

US 2003/0056976 A1 Mar. 27, 2003

Related U.S. Application Data

(62) Division of application No. 09/390,024, filed on Sep. 3, 1999, now Pat. No. 6,462,283.

(30) Foreign Application Priority Data

Sep. 22, 1998 (JP) .......................................... P10-268570

(51) Int. Cl.⁷ ................................................ H01K 3/10
(52) U.S. Cl. .............................. 29/852; 29/825; 29/842; 29/846; 29/852
(58) Field of Search .......................... 29/830, 852, 825, 29/845, 846, 842

(56) References Cited

U.S. PATENT DOCUMENTS

| | | | | |
|---|---|---|---|---|
| 3,597,834 A | * | 8/1971 | Lathrop et al. | 438/625 |
| 3,832,769 A | * | 9/1974 | Olyphant et al. | 29/830 |
| 4,811,081 A | * | 3/1989 | Lyden | 257/668 |
| 5,373,187 A | | 12/1994 | Sugino et al. | |
| 5,483,421 A | | 1/1996 | Gedney et al. | |
| 5,622,770 A | | 4/1997 | Dowdy et al. | |
| 5,677,576 A | * | 10/1997 | Akagawa | 257/785 |
| 5,748,209 A | | 5/1998 | Chapman et al. | |
| 5,796,163 A | | 8/1998 | Glenn et al. | |
| 5,886,415 A | * | 3/1999 | Akagawa | 257/789 |
| 5,915,753 A | * | 6/1999 | Motomura et al. | 29/830 |
| 6,011,694 A | | 1/2000 | Hirakawa | |
| 6,121,688 A | * | 9/2000 | Akagawa | 257/778 |
| 6,249,048 B1 | | 6/2001 | Heerman et al. | |

FOREIGN PATENT DOCUMENTS

| | | |
|---|---|---|
| JP | 05-259214 | 10/1993 |
| JP | 07-037931 | 2/1995 |
| JP | 09-260535 | 10/1997 |
| JP | 11-233566 | 8/1999 |

* cited by examiner

Primary Examiner—Carl J. Arbes
(74) Attorney, Agent, or Firm—Finnegan, Henderson, Farabow, Garrett & Dunner, L.L.P.

(57) ABSTRACT

A printed wired board is provided, in which an area for extracting liens for plating of the printed wired board is made small and at the same time the number of the extracting lines for plating within a packaging area is made small, resulting in an improvement of wiring efficiency. The circuit pattern formed on an insulating film has window portion and is not formed toward the periphery of the insulating film, and a bonding pad is electroplated, where the bonding pads are to be connected with a center-pad of a semiconductor by a bonding wire through the window portion. Accordingly, even when the shrinkage of semiconductor packages or narrow ball pitch is forwarded, the degree of freedom of drawing of circuit pattern in the printed wired board can be made large.

9 Claims, 12 Drawing Sheets

FABRICATING METHOD OF SEMICONDUCTOR DEVICES

This is a division of application Ser. No. 09/390,024 filed Sep. 3, 1999 now U.S. Pat. No. 6,462,283.

BACKGROUND OF THE INVENTION

1. Field of the Invention

The present invention relates to a fabricating method of semiconductor devices, a fabricating method of printed wired boards, and a printed wired board, all of which are suitable in improving wiring efficiency and in realizing easy drawing of circuit pattern, and in particular relates to a fabricating method of semiconductor devices of chip scale, package (CSP), a fabricating method of printed wired boards being used for the CSP, and a printed wired board being used for the CSP.

2. Description of the Related Art

In recent years, due to the demand for semiconductor packages of smaller size, chip scale packages (CSP) using a semiconductor chip in the center of which bonding pads are located is attracting attention to realize semiconductors of chip scale size.

FIG. 10 is a cross section showing schematically an example of such semiconductor package of chip scale size.

In this semiconductor device 1, on a semiconductor chip 3 of center-pad structure in which, for instance, two rows of pads 2 are disposed in the center portion thereof, a printed wired board 4 of tape shape is adhered through an adhesive layer 5, a bonding wire 6 is bonded by pressure bonding to a bonding pad of the printed wired board 4 and the pad 2 of the semiconductor chip 3 to connect these electrically, and thereon for instance humid-resistant insulating curing resin 7 such as silicone resin is potted to seal the bonding wire 6. Reference numeral 8 shows solder balls that are mounted on terminals that are concurrently terminals for external input/output and fixing means of the semiconductor device 1.

A printed wired board 4 that is used for the semiconductor package of this semiconductor device 1 is fabricated by the use of the steps shown in, for instance, FIG. 11A, FIG. 11B, FIG. 11C, FIG. 11D and FIG. 11E, and is further supplied to the following step shown in FIG. 11F.

First, copper foil 9 and insulating film 10 such as polyimide are adhered through adhesive (FIG. 11A). The copper foil 9 is etched out leaving only portions necessary as circuit pattern and pads, leads, terminals or the like, resulting in that which is shown by reference numeral 91 in FIG. 11B.

Next, except for the portion necessary of gold plating such as pads and terminals, resist pattern 92 is formed (FIG. 11C). Thereafter, by the use of electroplating, only on the exposed portion of the copper foil, a layer of gold plating 12 is formed on a under-layer of Ni (FIG. 11D).

Next, the portion corresponding, when adhered, to the position of the center-pads of a semiconductor chip is removed by die-cutting (FIG. 11E), thereafter, as a semiconductor package, the steps of assembling bonding wires 6, mounting solder balls 8 and others are carried out (FIG. 11F).

Incidentally, in such printed wired board 4 that is used in existing semiconductor package, as shown in FIG. 12, sandwiching an area corresponding to adhering position of a semiconductor chip that is shown by broken lines, extracting lines 19 for plating are disposed to supply electricity during electroplating. The extracting lines 19 for plating are connected electrically to terminals 20 for external input/output, bonding pads 21a and circuit pattern 22. Thus, the extracting lines 19 work as power supply lines during electroplating.

Then, in the step following the electroplating, a hatched portion shown in FIG. 12 corresponding to the center-pad position of a semiconductor chip is removed by the use of die cutting. Further, the printed wired board 4, in a prescribed step of assembling as a semiconductor device, is finally cut along a dimension line conforming to a semiconductor chip. The external periphery portion is discarded as waste.

Accordingly, in the printed wired board for a conventional semiconductor package of chip scale size, since other than the area necessary as package, an area for extracting lines for plating is also necessary, thus a larger area necessary for fabrication is required. Accordingly, the number that is obtained with one sheet becomes small, causing a problem that the cost of the boards becomes expensive.

Further, the extracting lines for plating are formed straddling both inside and outside of the area of a semiconductor package. The extracting lines outside of the area, being unnecessary as the package, after the plating, are cut off. However, the portion inside of the package area remains within the board, thereby causing lowering of wiring efficiency. Further, when shrinkage of semiconductor packages or narrow ball pitch is forwarded, there is a problem that the area of wiring is squeezed further to result in incapability of drawing of circuit pattern.

That is, from terminals 20 for external input/output, circuit pattern 22 extending to bonding pads 21a is intrinsically necessary, at the same time, circuit pattern 22 extending to extracting lines 19 for plating is also necessary. Accordingly the amount of the circuit pattern from terminals 20 for external input/output increases.

The present invention was carried out to solve such problems. An object of the present invention is to provide a fabricating method of semiconductor devices in which on a functional surface of a semiconductor chip of center-pad structure a printed wired board is adhered, and center-pads of the semiconductor chip and bonding pads of the printed wired board are connected through bonding wires. In this fabricating method, an area for extracting lines for plating of the printed wired board can be made small and at the same time the number of the extracting lines for plating within a packaging area can be made small, resulting in an improvement of wiring efficiency. Thereby, even when shrinkage of semiconductor packages or narrow ball pitch is forwarded, the degree of freedom of drawing of circuit pattern in the printed wired board can be made large.

Further, another object of the present invention is to provide a fabricating method of printed wired boards which are adhered to a functional surface of semiconductor chips of center-pad structure and the bonding pads thereof are connected to the center-pads of the semiconductor chips through bonding wires. In this fabricating method, an area for extracting lines for plating of the printed wired boards is made small and at the same time the number of the extracting lines for plating within a package area is made small, resulting in an improvement of wiring efficiency. Thereby, even when the shrinkage of semiconductor packages or narrow ball pitch is forwarded, the degree of freedom of drawing of circuit pattern in the printed wired board can be made large.

Further, the present invention involves a printed wired board that is adhered to a functional surface of a semiconductor chip of center-pad structure and the bonding pads thereof are connected to the center-pads of the semiconductor chip through bonding wires. An object of the present invention is to provide a printed wired board in which an area for extracting lines for plating of the printed wired board is made small and at the same time the number of the extracting lines for plating within a packaging area is made small, resulting in an improvement of wiring efficiency. Accordingly even when the shrinkage of semiconductor packages or narrow ball pitch is forwarded, the degree of freedom of drawing of circuit pattern in the printed wired board can be made large.

SUMMARY OF THE INVENTION

The present invention relates to a fabricating method of semiconductor devices in which on a functional surface of a semiconductor chip of center-pad structure a printed wired board is adhered and center-pads of the semiconductor chip and bonding pads of the printed wired board are connected through bonding wires. Here, metallic foil of a laminate plate that is formed by laminating metallic foil and insulating film is etched. Thereby, in an area corresponding to center-pads of the semiconductor chip being adhered an extracting line for plating, in an area corresponding to the other portion than the above of the semiconductor chip terminal portions for external input/output and bonding pads, and straddling both the areas circuit pattern electrically connecting these are formed, respectively, to obtain a printed wired board. The present invention comprises the aforementioned steps of forming a printed wired board. The present invention further comprises the steps of implementing electroplating to the terminals for external input/output and the bonding pads while supplying electricity from the extracting line for plating of the printed wired board, removing an area of the printed wired board corresponding to the center-pads of the semiconductor chip together with the extracting line for plating to form a window, adhering the insulating film side of the printed wired board to the semiconductor chip so that the center-pads are exposed from the window, connecting the bonding pads of the printed wired board and the center-pads of the semiconductor chip with bonding wires, and forming terminals for external input/output at the terminal portions for external input/output of the printed wired board.

Further, here, the semiconductor chip may be one preceding dicing operation in which a lot of semiconductor chips are formed in matrix on a wafer.

In addition, here, the laminate plate may be one that is formed by laminating copper foil and polyimide based film. As the polyimide based film polyamide-imide film can be employed, and polyester film also can be employed. Lamination can be implemented by coating the filming material on the metallic foil instead of connecting metallic foil and insulating film with adhesive.

In addition, here, as to the copper foil, the thickness thereof may be set in the range of from 10 μm to 20 μm, and as to the polyimide based film, the thickness thereof may be set in the range of from 25 μm to 75 μm.

Still further, the width of the window may be in the range of from 0.5 mm to 2 mm.

A fabricating method of printed wired boards of the present invention comprises the steps of forming, by carrying out etching to metallic foil of a laminate plate obtained by laminating the metallic foil and insulating film, an extracting line for plating in an area corresponding to center-pads of a semiconductor chip being adhered, terminal portions for external input/output and bonding pads in an area corresponding to the other portion than the above of the semiconductor chip, and circuit pattern electrically connecting these while straddling both the areas, respectively, implementing electroplating, while supplying electricity from the extracting line for plating of the laminate plate, to the terminal portions for external input/output and the bonding pads, and removing an area of the laminate plate corresponding to the center-pads of the semiconductor chip together with the extracting line for plating to form a window portion.

Here, the laminate plate may be one formed by laminating copper foil and polyimide based film. As the polyimide based film polyamide-imide film can be employed, and polyester film also can be employed. Lamination can be implemented by coating the filming material on the metallic foil instead of connecting metallic foil and insulating film with adhesive.

In addition, here, as to the copper foil, the thickness thereof may be set in the range of from 10 μm to 20 μm, and as to the insulating film, the thickness thereof may be set in the range of from 25 μm to 75 μm.

Still further, the width of the window may be in the range of from 0.5 mm to 2 mm.

A printed wired board of the present invention comprises terminal portions for external input/output and bonding pads both of which are disposed on the other area than that corresponding to the center-pads of a semiconductor chip being adhered, and circuit pattern connecting these electrically. Here, the circuit pattern that is laid out from the terminal potions for external input/output is only that which reaches the bonding pads, and the bonding pads are ones that are electroplated by supplying electricity from the center-pad side of the semiconductor chip.

That is, the printed wired board, being electroplated by supplying electricity from the side of center-pad of the semiconductor chip, is not formed extracting line for plating directing towards the periphery thereof.

Further, as to the electroplating layer, on a seed layer of Ni of the thickness of from 2 μm to 10 μm, a Au layer of the thickness of from 0.1 μm to 2 μm may be used.

As to the circuit pattern, the thickness thereof may be set in the range of from 30 μm to 150 μm.

Further, as the bonding wire, Au may be employed.

DESCRIPTION OF THE PREFERRED EMBODIMENTS

In the following, embodiments of the present invention will be explained with reference to the drawings.
Embodiment 1

FIG. 1, FIG. 2, FIGS. 3A, 3B, 3C, 3D, 3E and 3F, and FIG. 4 are diagrams showing a first embodiment of the present invention.

Figure 1:
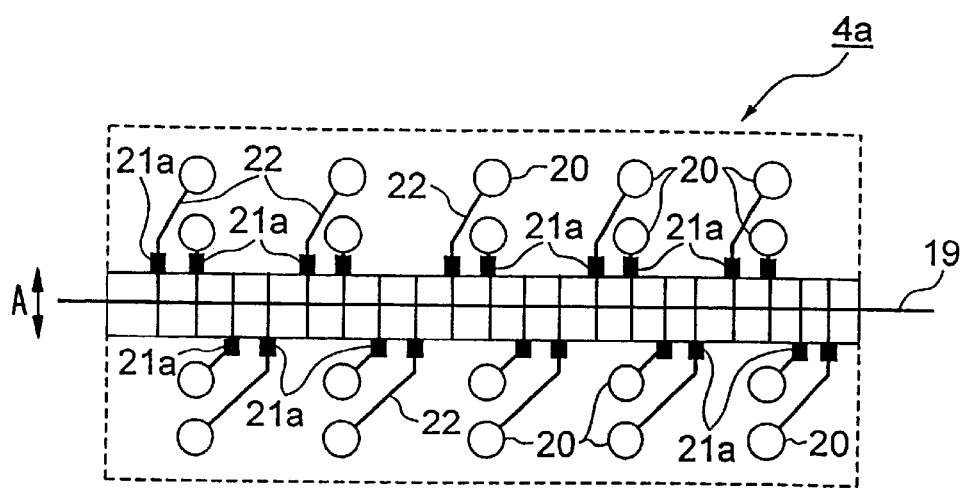
FIG. 1 is a plan-view showing schematically a structure of circuit pattern of tape like printed wired boards in one embodiment of the present invention.

In a printed wired board 4a of this embodiment, as shown in FIG. 1, in a hatched area corresponding to center-pads of a semiconductor chip, extracting line 19 for plating is disposed to supply electricity during electroplating, and to this extracting line 19 bonding pads 21a of the printed wired board 4a and terminals 20 for external input/output are connected electrically through circuit pattern 22.

The tape like printed wired board 4a, as identical as the existing tape like printed wired board, is formed by adhering copper foil and insulating film such as polyimide through adhesive and by patterning the copper foil as shown in the figure due to photo-resist technology.

Figure 2:
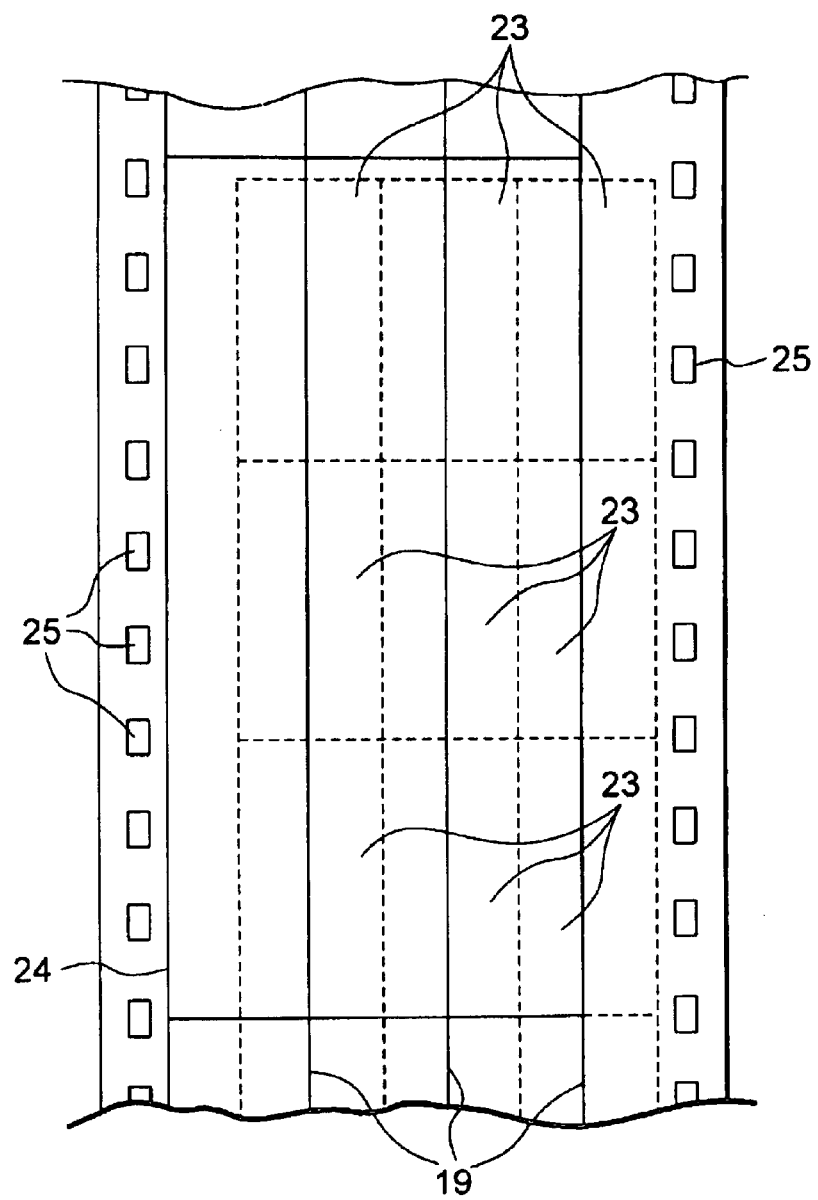
FIG. 2 is a plan-view showing schematically a state of arrangement of tape like printed wired boards in one embodiment of the present invention.

Then, normally, as shown in FIG. 2, several pieces of the unit tape 23 that corresponds to one piece of semiconductor chip are arranged in parallel in width direction (an example of three pieces are shown in the figure) and a lot of pieces of unit tape 23 are connected in length direction to form a series. At the same time, extracting lines 19 for plating formed on the position of the center-pads of semiconductor chips are connected electrically to each other through extracting mother line 24 for plating formed along one side of the tape, and further outside of the mother line sprockets 25 are formed for automatic supply.

In the printed wired board 4a for semiconductor devices of this embodiment, on the pattern shown in the figure by carrying out electroplating by supplying electricity to the necessary conductive pattern through the extracting mother line 24 for plating, on the copper pattern a layer of Au/Ni plating is formed. Thereafter, the hatched portion in which the extracting line 19 for plating is formed is cut out in window.

The above-mentioned processes will be explained with reference to FIG. 3A, FIG. 3B, FIG. 3C, FIG. 3D, and FIG. 3E.

Figure 3A:
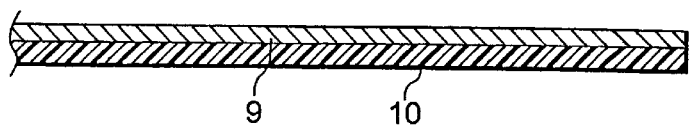
FIG. 3A, FIG. 3B, FIG. 3C, FIG. 3D, FIG. 3E and FIG. 3F are cross-sections showing fabricating processes of tape like printed wired boards and semiconductor devices in one embodiment of the present invention.
Figure 3B:
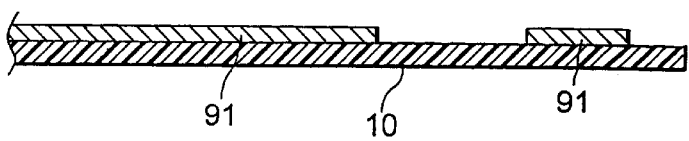

First, copper foil 9 and insulating film 10 such as polyimide are laminated (FIG. 3A). The copper foil 9 is etched out leaving necessary portions for circuit pattern and pads, terminals or the like, resulting in that which is shown by reference numeral 91 in FIG. 3B.

Figure 3C:
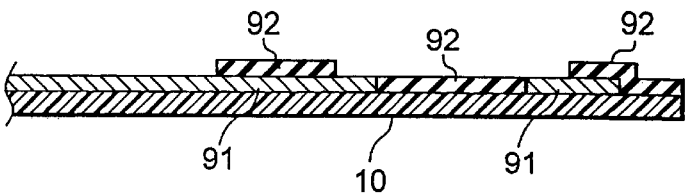
Figure 3D:
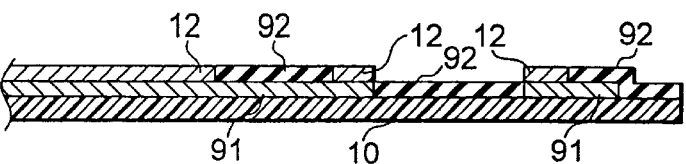

Next, except for portions that require Au plating such as pads or terminals, resist pattern 92 is formed (FIG. 3C). Then, only on the exposed portions of the copper foil, due to electroplating, a layer of Au plating 12 is formed on a seed layer of Ni (FIG. 3D).

Figure 3E:
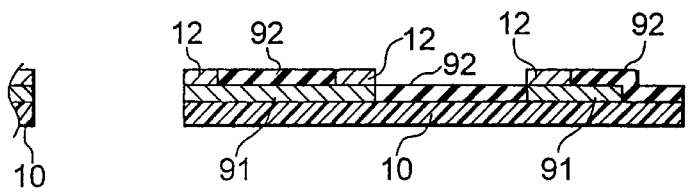
Figure 3F:
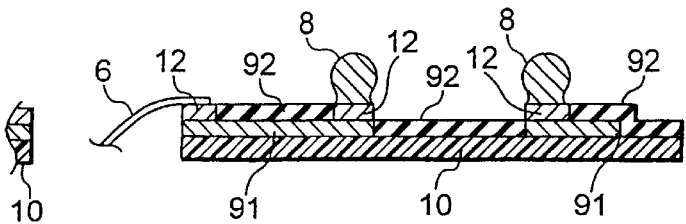

Next, a portion corresponding to the position of the center-pads of the semiconductor chip upon adhering is die-cut to remove (FIG. 3E).

Thereafter, on the tape like printed wired board 4a, the semiconductor chip of center-pads structure is adhered through adhesive so that it locates within broken lines in FIG. 1. The center-pads of the semiconductor chip that is exposed in the window formed in the printed wired board 4a and bonding pads 21a of the printed wired board 4a are connected electrically by bonding wires. After solder balls are mounted on the terminals 20 for external input/output (FIG. 3F), on the center-pad portion of the semiconductor chip, potting due to curing resin is implemented to complete a semiconductor device.

Figure 4:
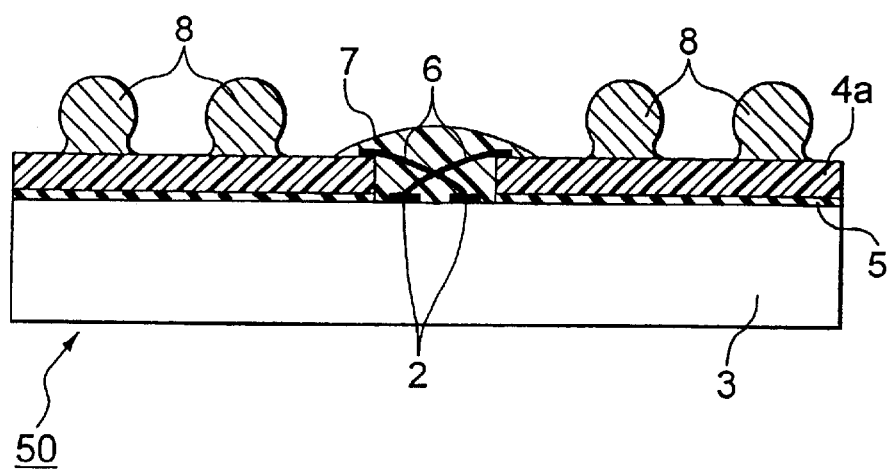
FIG. 4 is a cross-section showing schematically a semiconductor device of one embodiment of the present invention.

This semiconductor device is schematically shown with a cross-section in FIG. 4.

That is, in this semiconductor device 50, on a semiconductor chip 3 of center-pad structure in which, for instance, two rows of pads 2 are disposed in the center portion thereof, printed wired board 4a of tape shape is adhered through an adhesive layer 5, bonding wires 6 are bonded by pressure to bonding pads of the printed wired board 4a and the pads 2 of the semiconductor chip 3, and thereon humid-resistant insulating curing resin 7 such as silicone resin is potted to seal the bonding wires 6. Reference numeral 8 shows solder balls that are mounted on the terminals that are concurrently input/output terminals and fixing means of the semiconductor device 50.
Embodiment 2

Figure 5:
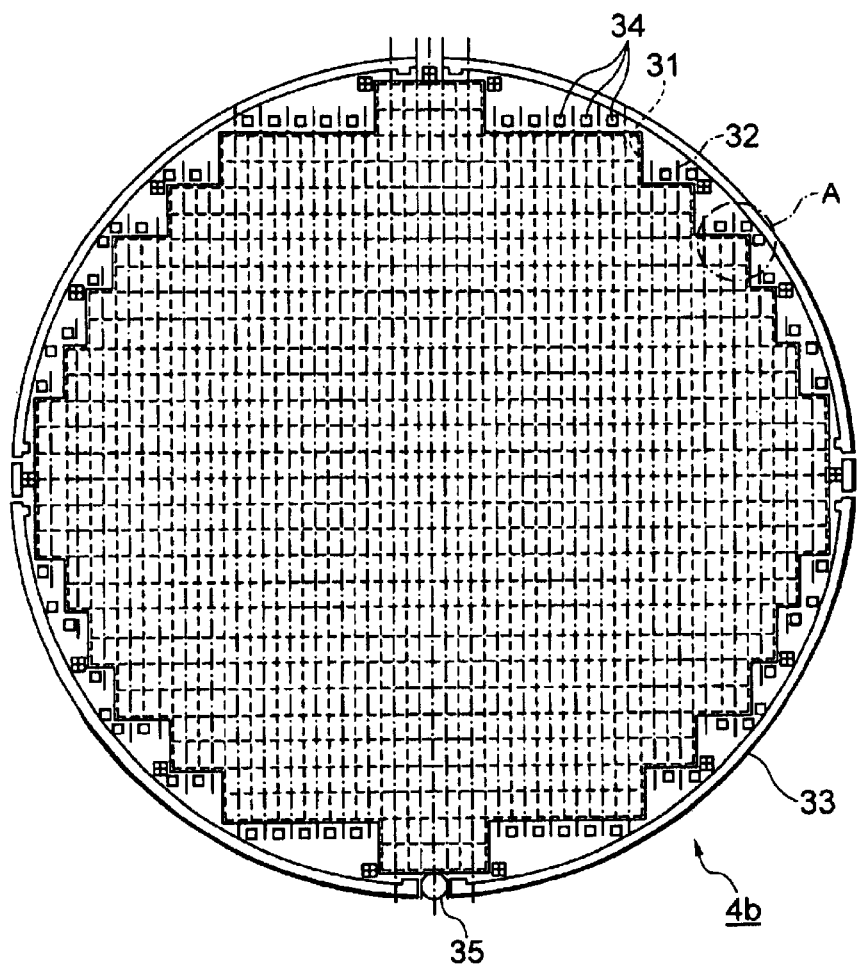
FIG. 5 is a plan-view showing schematically a structure of circuit pattern of printed wired boards in another embodiment of the present invention.
Figure 6:
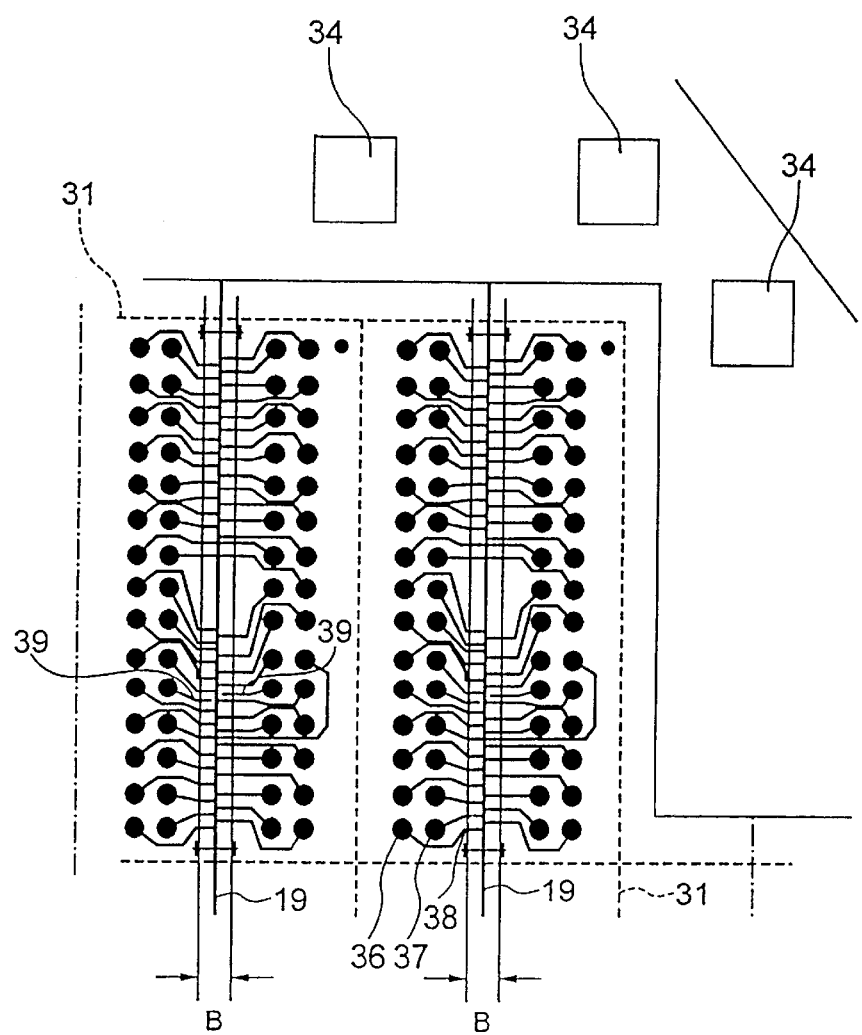
FIG. 6 is a plan-view showing a part of FIG. 5 enlarged.

FIG. 5 and FIG. 6 are diagrams showing another embodiment of the present invention.

FIG. 5 is a plan view of a tape like printed wired board 4b that is used by adhering on a semiconductor forming surface of a wafer in which a plurality of semiconductor chips are formed in matrix. One unit 31 of rectangle encircled by dotted lines of the figure corresponds to one semiconductor chip formed on a main surface of the wafer. Chain lines show extracting lines 32 for plating.

The width of the printed wired board 4b is naturally made larger than the dimension of the wafer being adhered, and moreover in the longer direction, unit of the tape like printed wired board shown in the figure corresponding to the wafer is formed continuously with a prescribed distance-apart.

As shown in the figure, along the contour of the wafer being adhered a circular pattern 33 made of copper foil to which extracting lines 32 for plating are connected is formed, and on the extension of each dicing line shown by one unit 31 of rectangle, openings 34 of square shape are formed for position display. Reference numeral 35 shows hole for alignment.

FIG. 6 is an enlargement of the portion A of FIG. 5. In the area B corresponding to center-pads in each unit of the semiconductor chip, an extracting line 19 for plating that supplies electricity during electroplating is disposed, and the end of the extracting line 19 for plating is connected to the circular pattern 33 made of copper foil.

Further, terminals 36 for external input/output of the printed wired board 4b is connected electrically to the extracting line 19 for plating through a route of wiring pattern 37 and bonding pads 38. Dummy pads 39 that does not require plating is not connected to the extracting line 19 for plating.

The tape like printed wired board 4b, as identical as an existing tape like printed wired board, is formed by adhering copper foil and insulating film such as polyimide through adhesive, and by patterning as shown in the figure by the use of photo-resist technology.

In the tape like printed wired board 4b of this embodiment, on the pattern shown in the figure, by executing electroplating by supplying electricity to the necessary pattern through the extracting line 19 for plating, on the copper pattern a layer of Au/Ni plating is formed. Thereafter, the areas B where the extracting line 19 for plating is formed are cut out in window.

To the tape like printed wired board 4b, in the following manner for instance, the wafer is adhered to form semiconductor devices.

That is, to the tape like printed wired board 4b, through adhesive, the main surface of the wafer of semiconductor chips of center-pad structure is adhered so that one unit of the semiconductor chips is located in a frame shown by the dotted lines, and the pads for each semiconductor chip exposed in the window formed in the printed wired board 4b and the bonding pads 38 of the printed wired board 4b are connected electrically through bonding wires.

Then, after solder balls are mounted on the terminals 36 for external input/output and fixed, potting due to curing resin is implemented to the wire-bonding portion, followed by die-cutting along the dotted lines to obtain individual semiconductor devices.

Incidentally, the embodiment 2 is one in which the semiconductor package in the embodiment 1 is completed in the state of wafer and this wafer is divided finally into individual semiconductor packages by die-cut. The semiconductor package of embodiment 3 that will be explained in the following can be completed in the state of wafer similarly and divided finally into individual semiconductor packages by die-cut.

Embodiment 3

FIG. 7A, FIG. 7B, FIG. 7C, FIG. 7D, FIG. 7E, FIG. 7F, FIG. 8A, FIG. 8B, FIG. 8C, and FIG. 9 are diagrams showing still another embodiment of the present invention.

FIG. 7A, FIG. 7B, FIG. 7C, FIG. 7D, FIG. 7E, and FIG. 7F show the fabricating steps of a printed wired board 4c being used in a semiconductor package.

Figure 7A:
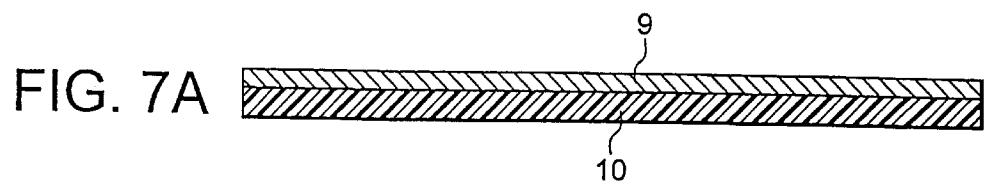
FIG. 7A, FIG. 7B, FIG. 7C, FIG. 7D, FIG. 7E and FIG. 7F are cross-sections showing the steps of fabrication of tape like printed wired boards in still another embodiment of the present invention.
Figure 7B:
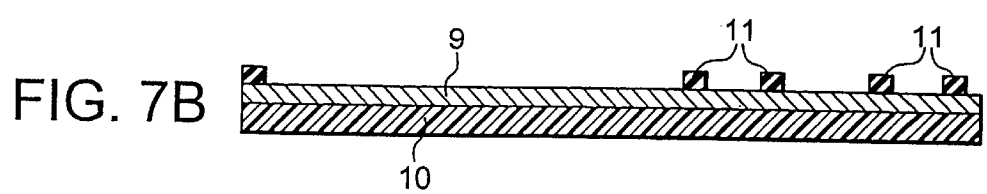
Figure 7C:
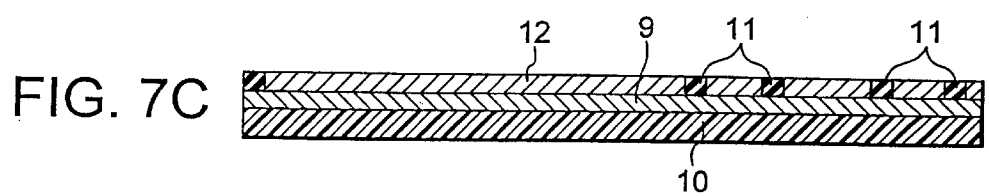

First, copper foil 9 and insulating film 10 such as polyimide are adhered through adhesive (FIG. 7A). On the copper foil 9 photo-resist is coated. Then, with a mask from which the portion necessary of gold plating such as circuit pattern or leads is cut off or with a mask from which the portion that does not require gold plating is cut off, exposure and development are carried out to form resist-pattern 11 (FIG. 7B). By the use of electroplating, only on the exposed portion of the copper foil, a layer of Au plating 12 is formed on a seed layer of Ni (FIG. 7C).

Figure 7D:
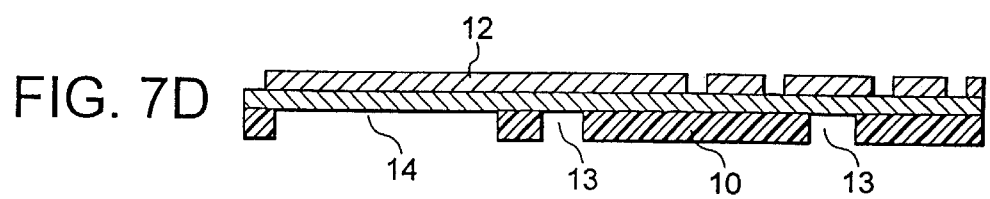
Figure 7E:
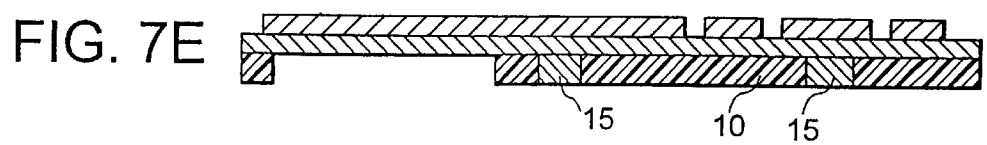
Figure 7F:
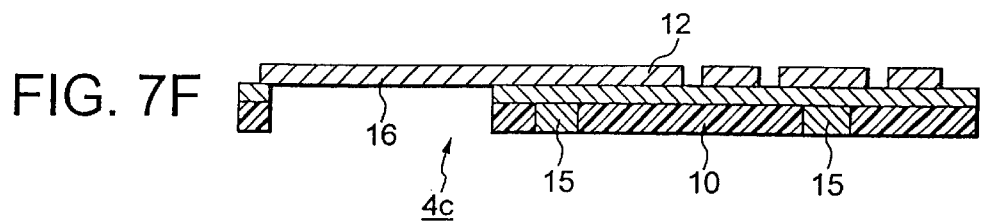

Then, the photo-resist pattern 11 is removed, and on the insulating film 10 holes 13 for forming external output pads (ball-mounted pads) and windows 14 for bonding are formed by irradiating laser beam (FIG. 7D). Into the holes 13, conductive paste 15 is filled to form the terminals for external input/output (FIG. 7E), and the exposed copper foil 9 of the window portion 14 is removed by etching to form lead portions 16 (FIG. 7F)

By undergoing the aforementioned each step, a printed wired board 4c is formed.

Figure 8A:
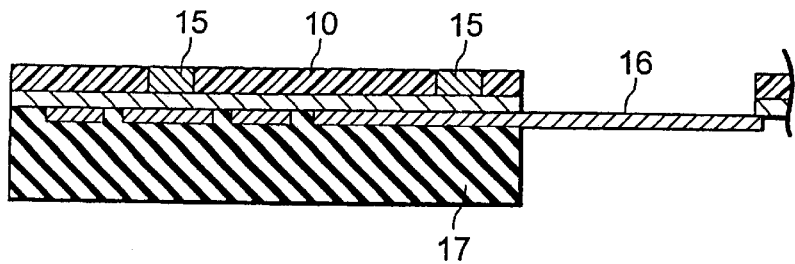
FIG. 8A, FIG. 8B and FIG. 8C are cross-sections showing the steps of connection of printed wired boards fabricated by the use of the fabricating steps shown in from FIG. 7A through FIG. 7F and semiconductor chips.
Figure 8B:
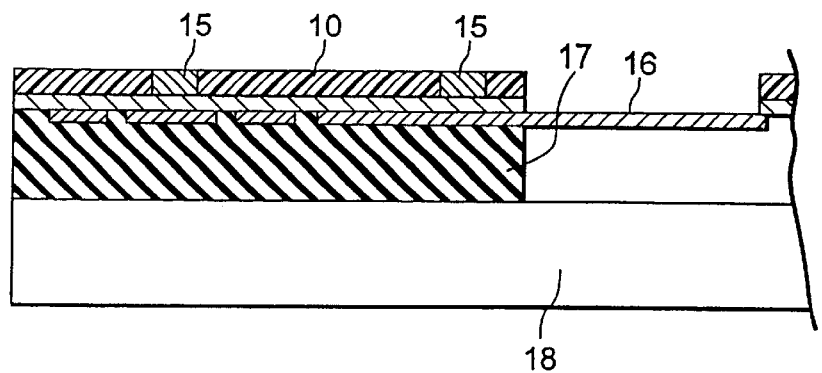
Figure 8C:
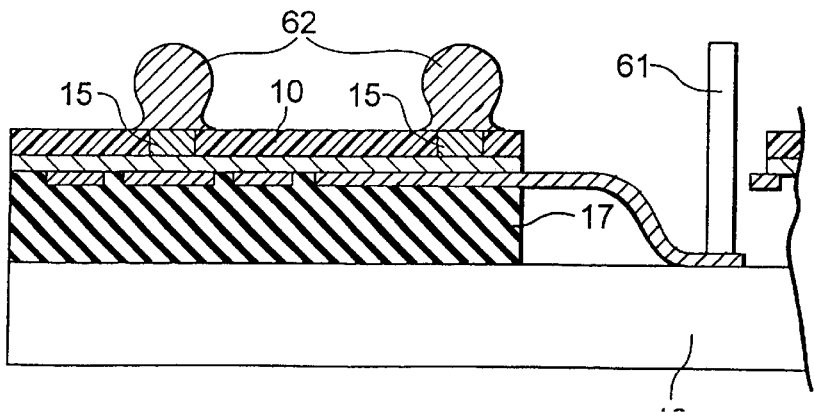

FIG. 8A, FIG. 8B and FIG. 8C show the steps of fabricating a semiconductor device in which thus obtained printed wired board 4c is used.

On the gold plating layer side 12 of the printed wired board 4c, leaving the lead portion 16 for bonding, a layer of elastomer 17 is formed by the use of screen-printing (FIG. 8A), and through this layer of elastomer 17 a semiconductor chip 18 is adhered to a corresponding position of the printed wired board 4c (FIG. 8B). Then, while the tip end of the lead portions 16 is being cut off by the use of a bonding tool 61, the tip end thereof is connected to the corresponding center-pad of the semiconductor chip 18 (FIG. 8C). In addition, to the terminals for external input/output, solder balls 62 is mounted (the same figure C) and in the center-pad portion, curing resin is potted (not shown in the figure) to form the semiconductor device.

Figure 9:
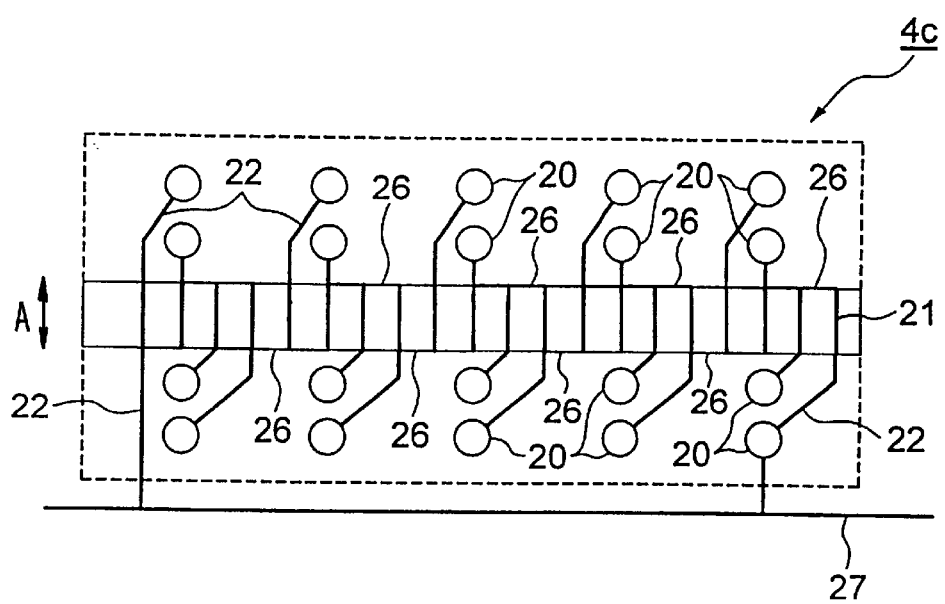
FIG. 9 is a plan-view showing schematically a structure of circuit pattern of tape like printed wired boards in still another embodiment of the present invention.
Figure 10:
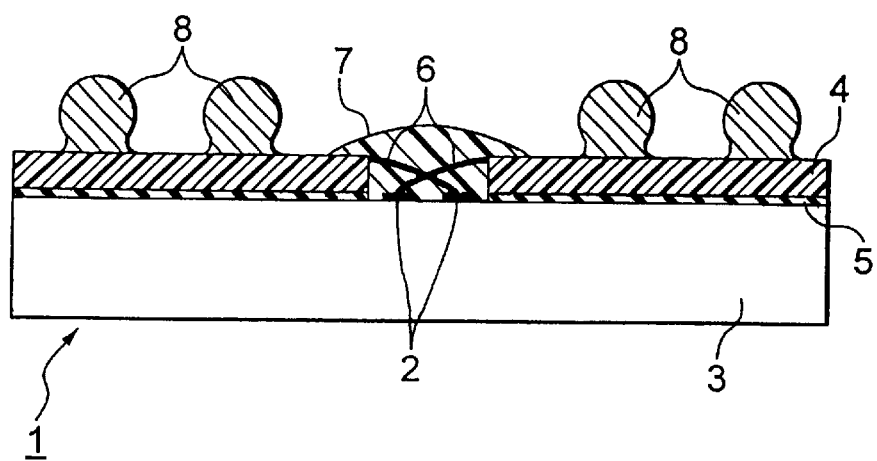
FIG. 10 is a cross-section showing schematically a semiconductor device of CSP.
Figure 11A:
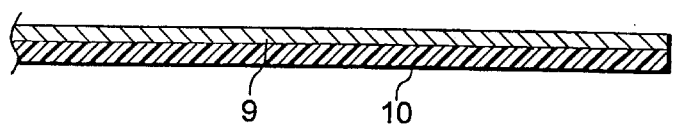
FIG. 11A, FIG. 11B, FIG. 11C, FIG. 11D, FIG. 11E and FIG. 11F are cross-sections showing the steps of fabrication of tape like printed wired boards being employed in semiconductor devices.
Figure 11B:
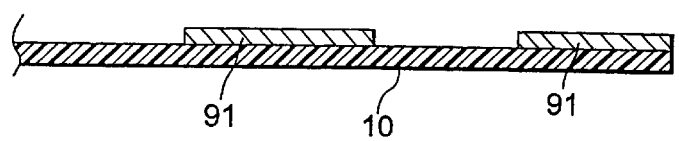
Figure 11C:
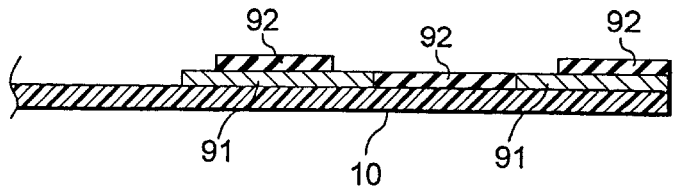
Figure 11D:
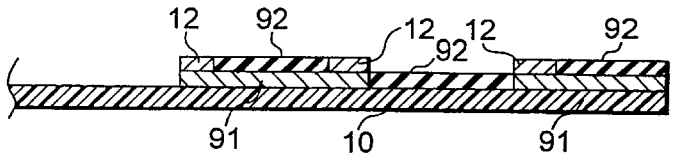
Figure 11E:
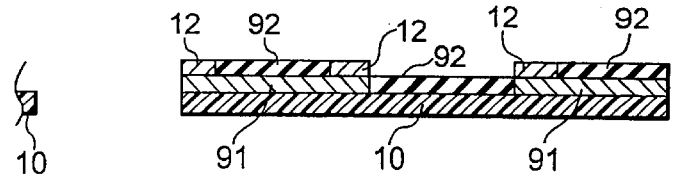
Figure 11F:
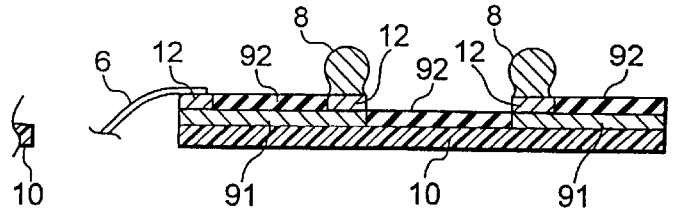
Figure 12:
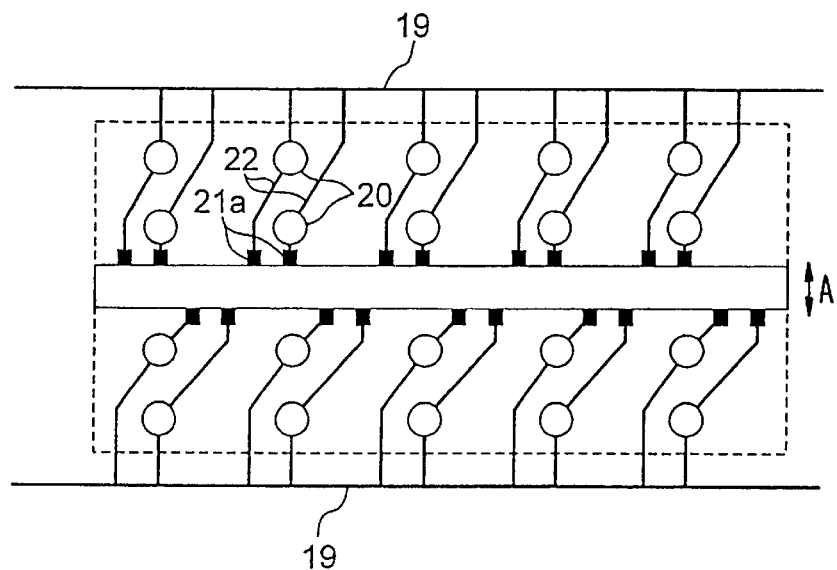
FIG. 12 is a diagram showing schematically a structure of circuit pattern of printed wired boards in existing semiconductor devices.

In the printed wired board 4c of this embodiment, as shown in FIG. 9, in the hatched area corresponding to position of the center-pad of the semiconductor chip, lead 21 is formed that connects electrically the printed wired board 4c and the semiconductor chip by pressure bonding the end of the lead to the pads of the semiconductor chip. The tip ends of the respective leads 21 are electrically connected by the use of conductive connection piece 26 for plating that is formed along the area shown by the hatched lines outside thereof and at the same time, the end portions thereof are connected electrically to an extracting mother line 27 for plating formed along the side.

In the tape like printed wired board 4c of this embodiment, on the pattern shown in FIG. 9, by supplying electricity to the necessary copper pattern through the extracting mother line 27 for plating and the conductive connection piece 26 for plating to execute electroplating, a layer of Au/Ni plating is formed on the copper pattern. Thereafter, the hatched portion where the leads 21 are formed is removed by the use of laser beam leaving the leads 21.

On the tape like printed wired board 4c thus obtained, as shown in FIG. 8A, FIG. 8B and FIG. 8C, through adhesive, the semiconductor chip 18 of center-pad structure is adhered to locate inside the broken lines, and to the pads of the semiconductor chip exposed in the window formed on the printed wired board 4c, the tip end of the leads 21 of the printed wired board 4c is connected by the use of bonding tool. Then, after solder balls are mounted on the terminals for external input/output to fix, potting due to curing resin is implemented to the wire-bonding portion to complete the semiconductor device.

As explained in detail in the aforementioned respective embodiments, according to the present invention, by disposing extracting line for plating in the removing area for bonding connection, the necessary area as a printed wired board can be made small. The decrease of the board area can reduce the cost of board.

Further, circuit pattern connecting terminals for external connection and bonding pads can be shared with circuit pattern connecting the terminals for external connection and the extracting line for plating. Accordingly, wiring efficiency can be improved to cope with a trend of narrower pitch.

The invention may be embodied in other specific forms without departing from its spirit or essential characteristics. The described embodiments are to be considered as illustrative and not restrictive. The scope of invention is, therefore, indicated by the appended claims rather than by the foregoing description. All changes which come within the meaning and the range of equivalency of the claims are to be embraced within their scope.

This invention is disclosed in Japanese Patent Application No. 10-268570 filed on Sep. 22, 1998, and the entire disclosure thereof is incorporated herein by reference.

What is claimed is:

1. A fabricating method of semiconductor devices in which on a functional surface of a semiconductor chip of center-pad structure a printed wired board is adhered and center-pads of the semiconductor chip and bonding pads of the printed wired board are connected through bonding wires, comprising the steps of:

implementing etching to metallic foil of a laminate plate that is formed by laminating the metallic foil and insulating film to form an extracting line for plating in an area corresponding to center-pads of the semiconductor chip being adhered, terminal portions for external input/output and bonding pads in an area corresponding to the other portion than the above area of the semiconductor chip, and circuit pattern electrically connecting these while straddling both the areas, respectively, to obtain the printed wired board;

carrying out electroplating to the terminals for external input/output and the bonding pads while supplying electricity from the extracting line for plating of the printed wired board;

removing an area of the printed wired board corresponding to the center-pads of the semiconductor chip together with the extracting line for plating to form a window;

adhering the insulating film side of the printed wired board to the semiconductor chip so that the center-pads are exposed from the window;

connecting the bonding pads of the printed wired board and the center-pads of the semiconductor chip with bonding wires; and, forming the terminals for external input/output at the terminal portions for external input/output of the printed wired board.

2. The fabricating method of semiconductor devices as set forth in claim 1:

wherein the semiconductor chip is one preceding dicing operation in which a lot of semiconductor chips are formed in matrix on a wafer.

3. The fabricating method of semiconductor devices as set forth in claim 1:

wherein the laminate plate is one that is formed by laminating copper foil and polyimide based film.

4. The fabricating method of semiconductor devices as set forth in claim 3:

wherein a thickness of the copper foil is in the range of from 10 $\mu$m to 20 $\mu$m, and a thickness of the polyimide based film is in the range of from 25 $\mu$m to 75 $\mu$m.

5. The fabricating method of semiconductor devices as set forth in claim 1:

wherein a width of the window is in the range of from 0.5 mm to 2 mm.

6. A fabricating method of printed wired boards, comprising the steps of:

carrying out etching to metallic foil of a laminate plate obtained by laminating metallic foil and insulating film to form an extracting line for plating in an area corresponding to center-pads of a semiconductor chip being adhered, terminal portions for external input/output and bonding pads in an area corresponding to the other portion than the above of the semiconductor chip, and circuit pattern electrically connecting these while straddling both the areas, respectively;

implementing electroplating, while supplying electricity from the extracting line for plating of the laminate plate, to the terminal portions for external input/output and the bonding pads; and removing an area of the laminate plate corresponding to the center-pads of the semiconductor chip together with the extracting line for plating to form a window.

7. The fabricating method of printed wired boards as set forth in claim 6:

wherein the laminate plate is one formed by laminating copper foil and polyimide based film.

8. The fabricating method of printed wired boards as set forth in claim 7:

wherein the copper foil has a thickness of from 10 $\mu$m to 20 $\mu$m, and the polyimide based film has a thickness of from 25 $\mu$m to 75 $\mu$m.

9. The fabricating method of printed wired boards as set forth in claim 6:

wherein the window has a width of from 0.5 mm to 2 mm.

* * * * *